United States Patent
Kobayashi

(10) Patent No.: US 11,875,042 B2
(45) Date of Patent: Jan. 16, 2024

(54) MEMORY SYSTEM AND CONTROL METHOD FOR CONTROLLING CHARGING CAPACITOR OF A POWER SUPPLY CIRCUIT

(71) Applicant: KIOXIA CORPORATION, Tokyo (JP)

(72) Inventor: Hiroki Kobayashi, Kanagawa (JP)

(73) Assignee: Kioxia Corporation, Tokyo (JP)

( * ) Notice: Subject to any disclaimer, the term of this patent is extended or adjusted under 35 U.S.C. 154(b) by 156 days.

(21) Appl. No.: 17/409,764

(22) Filed: Aug. 23, 2021

(65) Prior Publication Data

US 2022/0197520 A1    Jun. 23, 2022

(30) Foreign Application Priority Data

Dec. 18, 2020 (JP) .................... 2020-210149

(51) Int. Cl.

| | | |
|---|---|---|
| G11C 5/14 | (2006.01) | |
| G06F 3/06 | (2006.01) | |
| G11C 16/04 | (2006.01) | |
| G11C 16/10 | (2006.01) | |
| G11C 16/30 | (2006.01) | |
| G06F 1/30 | (2006.01) | |
| G06F 1/28 | (2006.01) | |
| H02M 3/158 | (2006.01) | |

(52) U.S. Cl.
CPC ............ G06F 3/0625 (2013.01); G06F 1/28 (2013.01); G06F 1/30 (2013.01); G06F 3/0659 (2013.01); G06F 3/0679 (2013.01); G11C 16/0483 (2013.01); G11C 16/10 (2013.01); G11C 16/30 (2013.01); H02M 3/158 (2013.01)

(58) Field of Classification Search
CPC . G06F 3/0625; G06F 1/28; G06F 1/30; G06F 3/0659; G06F 3/0679; G06F 1/26; G06F 3/0634; G06F 3/0653; G06F 11/2015; G11C 16/0483; G11C 16/10; G11C 16/30; G11C 16/26; G11C 16/32; G11C 5/14; H02M 3/158; H02M 1/007; H02M 3/156
USPC ........................................................ 365/226
See application file for complete search history.

(56) References Cited

U.S. PATENT DOCUMENTS 6,232,745 B1    5/2001  Tokuyama
9,304,560 B2    4/2016  Laird et al.
(Continued)

FOREIGN PATENT DOCUMENTS

CN    109842171 A    6/2019
JP    2016115171 A    6/2016
(Continued)

*Primary Examiner* — Tha-O H Bui
(74) *Attorney, Agent, or Firm* — Kim & Stewart LLP

(57) ABSTRACT

According to one embodiment, a memory system includes a non-volatile memory, a controller for writing data to the non-volatile memory and reading data from the non-volatile memory, and a power supply circuit. The power supply circuit includes a capacitor. The power supply circuit supplies power to the non-volatile memory and the controller from an external power supply and supplies power to the non-volatile memory and the controller from the capacitor if the external power supply is interrupted. The controller controls the power supply circuit to charge the capacitor when current consumption of the non-volatile memory is less than some first current level.

20 Claims, 10 Drawing Sheets

(56) References Cited

U.S. PATENT DOCUMENTS

| | | | |
|---|---|---|---|
| 9,426,748 B2 | 8/2016 | Taha et al. | |
| 10,705,155 B2* | 7/2020 | An | G11C 5/143 |
| 2016/0062435 A1* | 3/2016 | Arakawa | G06F 1/263 |
| | | | 713/340 |
| 2019/0162797 A1 | 5/2019 | An et al. | |
| 2020/0310509 A1 | 10/2020 | Gendler et al. | |

FOREIGN PATENT DOCUMENTS

| | | |
|---|---|---|
| TW | 468300 B | 12/2001 |
| TW | 201013381 A | 4/2010 |
| TW | 201330453 A | 7/2013 |

* cited by examiner

FIG. 6

| COMMAND | WEIGHT |
|---------|--------|
| ERASE | w1(t) |
| DATA-IN | w2(t) |
| PROGRAM | w3(t) |
| READ | w4(t) |
| ... | ... |

112

MEMORY SYSTEM AND CONTROL METHOD FOR CONTROLLING CHARGING CAPACITOR OF A POWER SUPPLY CIRCUIT

CROSS-REFERENCE TO RELATED APPLICATION

This application is based upon and claims the benefit of priority from Japanese Patent Application No. 2020-210149, filed Dec. 18, 2020, the entire contents of which are incorporated herein by reference.

FIELD

Embodiments described herein relate generally to a memory system and a control method for controlling a non-volatile memory.

BACKGROUND

As an example of a memory system including a non-volatile memory, there is a solid-state drive (SSD).

Some SSDs have a power loss protection (PLP) function to prevent data from being lost when an unintended interruption, such as a power failure of an externally supplied primary power supply, occurs during writing the data. Implementing the PLP function requires a backup power supply. As an example of the backup power supply, there is a capacitor. When a drop in a voltage of the primary power supply is detected, the PLP function operates. By using electric power (or energy) stored in the capacitor, data in the process of writing and data to be written can be stored in a non-volatile memory in a non-volatile manner.

Since the stored energy of the capacitor is reduced by natural discharging even when the PLP function does not operate, it is necessary to charge the capacitor regularly. When the charging of the capacitor occurs when current consumption of the SSD is large, the current consumption is temporarily increased, and a peak current may exceed an allowable current value of the SSD. In order to prevent this phenomenon, it is necessary to reduce the current consumption of the SSD, but performance of the SSD would be sacrificed.

As described above, in a memory system provided with the PLP function, it is difficult to achieve both the peak current requirements and the performance requirements.

BRIEF DESCRIPTION OF THE DRAWINGS

FIG. 6 is a diagram illustrating an example of weight factors stored in a weight table.

DETAILED DESCRIPTION

Figure 1:
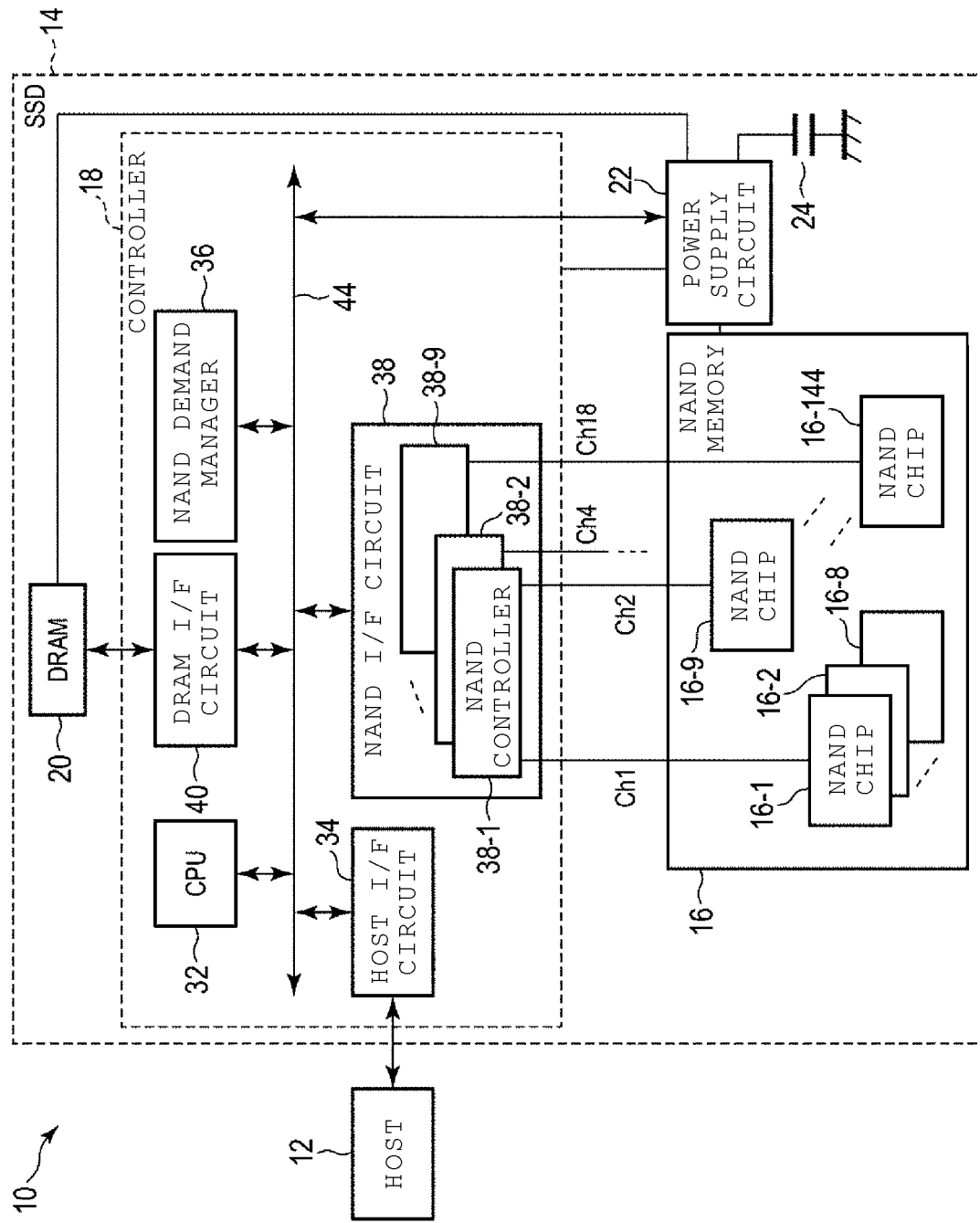
FIG. 1 is a block diagram of an information processing system including a memory system according to an embodiment.

According to one embodiment, a memory system includes a non-volatile memory, a controller for writing data to the non-volatile memory and reading data from the non-volatile memory, and a power supply circuit. The power supply circuit includes a capacitor for power loss protection functions or the like. The power supply circuit supplies power to the non-volatile memory and the controller from an external power supply during normal operations and supplies power to the non-volatile memory and the controller from the capacitor if the external power supply is interrupted. The controller controls the power supply circuit to preferentially charge the capacitor when current being consumed by the non-volatile memory is less than some predetermined first current level.

Hereinafter, certain example embodiments will be described with reference to the drawings. The description provides examples of devices and methods for explaining certain technical concepts of the present disclosure, but the embodiments are not limited to details, such as the specific structures, shapes, arrangements, materials, and the like of the components of the example embodiments described below. Such modifications to the embodiments that those skilled in the art will readily conceive are included in the scope of the present disclosure.

In order to clarify the description, the size, thickness, plane size, shape, or the like of each component depicted in the drawings are schematically represented and, as such, may be different from those in actual embodiments to be schematically represented.

In the different drawings, elements may be depicted as having different dimensional relationships and ratios between each other. The corresponding elements in different drawings are generally denoted by the same reference numerals, and duplicate description of repeated elements may be omitted.

Although some elements may be referred to by particular names, these names are merely examples, and such elements can be referred by other names.

In the following description, the term "connection" refers to not only direct connection but also connection via other elements.

(System Configuration)

FIG. 1 is a block diagram illustrating an example of a configuration of an information processing system including a memory system according to an embodiment. The memory system is a storage device which writes data into, and reads data from, non-volatile memory. In the present example, the memory system is an SSD. As examples of non-volatile memory, there are NAND flash memory, NOR flash memory, magneto-resistive random access memory (MRAM), phase-change random access memory (PRAM), resistive random access memory (ReRAM), ferroelectric random access memory (FeRAM), and the like. In the present example, the non-volatile memory is a NAND flash memory (hereinafter, simply referred to as a NAND memory).

An information processing system 10 includes a host device 12 (hereinafter, simply referred to as host 12) and an SSD 14.

The host 12 is an information processing device as an external device that accesses the SSD 14. The host 12 may be a server (storage server) that stores a large amount of data in the SSD 14. The host 12 may be a personal computer. The SSD 14 may be an SSD for business use incorporated in a server such as at a data center. The SSD 14 may be an SSD for personal use incorporated in a personal computer.

The SSD 14 includes a NAND memory 16, a controller 18, a dynamic random access memory (DRAM) 20, a power supply circuit 22, a PLP capacitor 24, and the like. The SSD 14 may be used as a main storage of the host 12. The SSD 14 may be built in the host 12 or may be provided outside the host 12 and connected to the host 12 via a cable or a network.

The controller 18 writes data into the NAND memory 16 or reads data from the NAND memory 16 according to a request transmitted from the host 12. Furthermore, the controller 18 generates a control signal for controlling a value of a voltage generated by the power supply circuit 22 according to the request transmitted from the host 12 and various information transmitted from the power supply circuit 22. The controller 18 transmits the generated control signal to the power supply circuit 22. Accordingly, the controller 18 controls a generation of a plurality of voltages applied to respective components (for example, the NAND memory 16, the controller 18, and the DRAM 20) of the SSD 14. The controller 18 may be or comprise a circuit such as a system on a chip (SoC).

The DRAM 20 is an example of a volatile memory. The DRAM 20 is, for example, a double data rate 3 low voltage (DDR3L) standard DRAM. The DRAM 20 may be provided with a write buffer, a read buffer, a cache area for a look-up table (LUT), and a storage area of system management information. The write buffer is a buffer area for temporarily storing data being written to the NAND memory 16. The read buffer is a buffer area for temporarily storing data read from the NAND memory 16. The cache area for the LUT is an area for caching an address conversion table (also referred to as a logical-to-physical (L2P) address conversion table). The LUT provides a correspondence between each logical address designated by the host 12 and each physical address of the NAND memory 16. The storage area of the system management information is an area for storing various values, various tables, and the like used during operations of the SSD 14.

The DRAM 20 may be provided outside the controller 18 and/or inside the controller 18. A static random access memory (SRAM) capable of higher speed access may be used instead of the DRAM 20.

The NAND memory 16 may include a plurality of (for example, 144) NAND chips 16-$i$ ($i$=1 to 144). Each NAND chip 16-$i$ includes a memory cell array including a plurality of memory cells arranged in a matrix. Each NAND chip 16-$i$ may be a memory chip having a two-dimensional structure or a memory chip having a three-dimensional structure.

The memory cell array of a NAND chip 16-$i$ contains a plurality of blocks. Each block contains a plurality of pages. The block functions as a minimum unit for a data erasing operation. Each page contains a plurality of memory cells connected to the same word line. The page is the smallest unit for a data write operation and a data read operation. One page is a data size of a writing unit and a reading unit. The data of one page can be stored in the DRAM 20. In a case of the writing, the data of a writing unit of one page in size is read from the DRAM 20 then written into the NAND memory 16. For this reason, when an external power supply is unintentionally interrupted during the writing, the data in the DRAM 20 during the writing is lost if a backup power supply does not exist. In the present embodiment, the backup power supply is provided, and when the external power supply is unintentionally interrupted, the data in the process of being written but still in the DRAM 20 can be written into the NAND memory 16 by using power from the backup power supply. It is noted that a word line may be used as a unit for the data write operation or the data read operation instead of a page. In this case, the one-word line data is the writing unit or the reading unit.

The power supply circuit 22 generates a plurality of power supply voltages required for the respective components of the SSD 14 from a single or a plurality of external voltages supplied from the external power supply. The external power supply may be a power supply provided in the host 12. A power supply line is not specifically illustrated in FIG. 1, but such a line may be provided via the host 2 or otherwise. The power supply circuit 22 may be a single integrated circuit (IC) or a plurality of integrated circuits. Information indicating various states of the power supply circuit 22 is transmitted to the controller 18 in accordance with a predetermined communication standard. The communication standard between the power supply circuit 22 and the controller 18 may conform to, for example, a serial communication standard. An example of the serial communication standard is an I2C system (inter-integrated circuit system, also referred to as I$^2$C). In the present example, it is assumed that the communication standard between the power supply circuit 22 and the controller 18 conforms to the I2C system.

The controller 18 generates the control signal for controlling the value of the power supply voltage generated by the power supply circuit 22 according to the request transmitted from the host 12 and various information transmitted from the power supply circuit 22. The controller 18 transmits the generated control signal to the power supply circuit 22. Accordingly, the controller 18 controls the generation of a plurality of the power supply voltages applied to the respective components of the SSD 14.

The PLP capacitor 24 for the backup power supply is connected to the power supply circuit 22. The PLP capacitor 24 supplies, energy for a power loss protection (PLP) function to the power supply circuit 22 to protect data during the writing if the external power supply is unintentionally interrupted such as by a power outage. As some examples of a PLP capacitor 24, there are an electric double layer capacitor, a conductive polymer aluminum electrolytic capacitor, and a conductive polymer tantalum solid electrolytic capacitor.

After the power supply is interrupted, the power supply circuit 22 continues to supply the power supply voltage to the NAND memory 16, the controller 18, and the DRAM 20 for a certain time interval by using the energy from the PLP capacitor 24.

The capacitance of the PLP capacitor 24 is set to be slightly larger than a target capacitance that can store the energy required to complete the writing of the data into the NAND memory 16 during the writing (to implement the PLP function) within the certain time interval. This is because, when the capacitance of the PLP capacitor is provided with additional margin beyond the bare minimum amount necessary, the PLP function can continue to be implemented even though the capacitance of the capacitor is slightly decreased due to temperature changes or degradation over time. For example, when the amount of capacitance decrease is within 30% of an initial capacitance value, the initial (designed) capacitance of the PLP capacitor may be set to about 1.43 times the minimum target capacitance in order to implement the PLP function even after some decrease or variance in the capacitance value.

The controller 18 includes a CPU 32, a host interface (host I/F) circuit 34, a NAND demand manager 36, a NAND interface (NAND I/F) circuit 38 (also referred to as a NAND controller 38), a DRAM interface (DRAM I/F) circuit 40, and the like. The CPU 32, the host I/F circuit 34, the NAND demand manager 36, the NAND I/F circuit 38, and the DRAM I/F circuit 40 are connected to a bus line 44. The power supply circuit 22 is also connected to the bus line 44.

The CPU 32 executes firmware stored in the NAND memory 16 and implements various functions accordingly. As examples of these various functions, there are charging control of the PLP capacitor 24 and control of a power supply voltage generation operation of the power supply circuit 22.

The host 12 is electrically connected to the host I/F circuit 34, the NAND memory 16 is electrically connected to the NAND I/F circuit 38, and the DRAM 20 is electrically connected to the DRAM I/F circuit 40.

The host I/F circuit 34 that electrically connects the host 12 and the SSD 14 in this example conforms to a standard such as small computer system interface (SCSI), serial attached SCSI (SAS), AT attachment (ATA), serial ATA (SATA), PCI express (PCIe®), Ethernet®, Fiber channel, NVM express (NVMe®), universal serial bus (USB®), universal asynchronous receiver/transmitter (UART), or the like.

The NAND I/F circuit 38 electrically interconnects the controller 18 and the NAND memory 16 and conforms to a standard such as Toggle DDR or open NAND flash interface (ONFI). The NAND I/F circuit 38 may include a plurality of NAND controllers 38-$j$ (where j=1 to 9 in this example). Each NAND controller 38-$j$ is connected to the NAND memory 16 via a plurality of channels (two channels in this example). Since the NAND memory 16 includes 144 NAND chips 16-$i$, one channel of one NAND controller 38-$j$ performs interleaving control for eight NAND chips. That is, the NAND I/F circuit 38 is connected to the NAND memory 16 via a plurality of channels (for example, 18).

The NAND demand manager 36 is hardware for transmitting the request issued by the host 12 to the NAND memory 16 to the NAND I/F circuit 38. For example, when the NAND demand manager 36 receives a read request, a write request, an erase request, or the like from the host 12, the NAND demand manager 36 transmits a command issuance request for a read command, a write command, an erase command, or the like to the NAND controller 38-$j$. Alternatively, when the NAND demand manager 36 receives a background process request for the NAND memory 16, such as a garbage collection (also referred to as compaction) request, a refresh request, a debug request, or the like issued from the controller 18, the NAND demand manager 36 transmits the command issuance request regarding a garbage collection command, a refresh command, a debug command, or the like to a NAND controller 38-$j$.

When the NAND controller 38-$j$ receives the command issuance request from the NAND demand manager 36, the NAND controller 38-$j$ acquires information necessary for issuing a command to a NAND chip 16-$i$ and issues the command. The NAND controller 38-$j$ acquires, for example, the physical address and a write data as the information necessary for issuing the command from the CPU 32 or the NAND demand manager 36. The NAND controller 38-$j$ transmits the execution result for the issued command to the NAND demand manager 36 as response information. The NAND demand manager 36 receives the response information issued from the NAND controller 38-$j$ and notifies a request source of the response information.

(Configuration of Power Supply Circuit 22)

Figure 2:
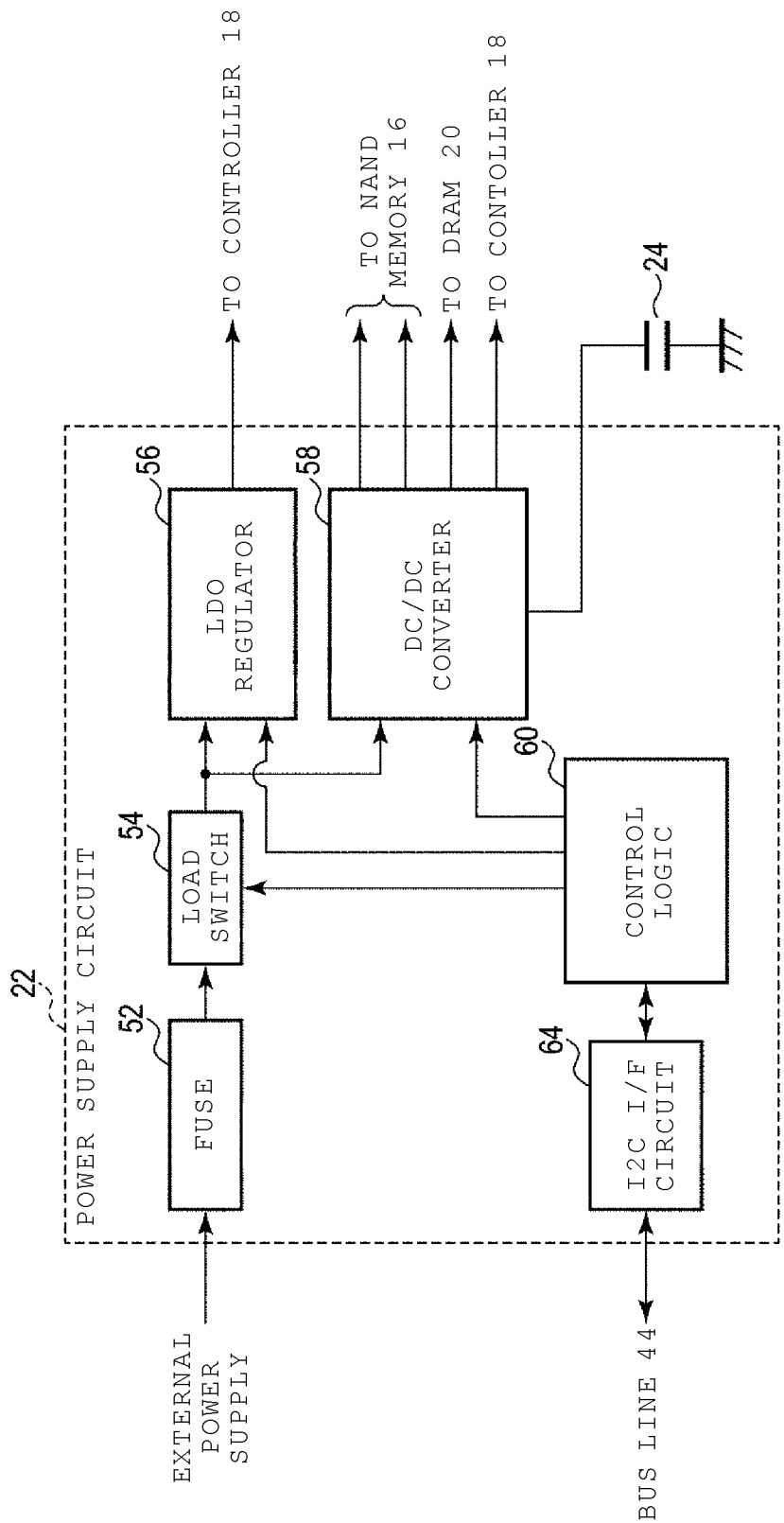
FIG. 2 is a block diagram of a power supply circuit.

FIG. 2 is a block diagram illustrating an example of a configuration of the power supply circuit 22. The power supply circuit 22 includes a fuse 52, a load switch 54, an LDO (Low Dropout) regulator 56, a DC/DC converter 58, a control logic 60, and an I2C I/F circuit 64. The external power supply (not illustrated) generates an external power supply voltage of, for example, DC 12 V. A current having a magnitude corresponding to the external power supply voltage is supplied to the low dropout (LDO) regulator 56 and the DC/DC converter 58 via the fuse 52 and the load switch 54, which are connected in series. It is noted that the host 12 may include the external power supply therein, and a current corresponding to the external power supply voltage may be supplied from the host 12 to the power supply circuit 22. A single circuit or a plurality of circuits constituting the power supply circuit 22 may be referred to as a power management IC (PMIC).

The fuse 52 comprises a metal fuse that is blown (opened) when an overcurrent of a certain current or more flows. When the fuse 52 is blown, the external power supply voltage is no longer applied to the load switch 54 until the fuse is replaced. It is noted that the fuse 52 is not limited to a metal fuse, and the fuse 52 may include an electronic fuse that becomes non-conducting when the overcurrent is detected.

The load switch 54 is an on/off switch and is normally in an ON state. That is, without intervention or control the load switch 54 will be in the ON state. In the ON state, the load switch 54 outputs a voltage obtained by subtracting a dropout voltage from the applied voltage. Similarly to the fuse 52, the load switch 54 is turned to an off state when an overcurrent (current above a certain value) flows. In the OFF state, the load switch 54 outputs 0 V. The value of the overcurrent at which the fuse 52 is blown may or may not be equal to the value of the overcurrent at which the load switch 54 changes from the ON state to the OFF state. The overcurrent value for the fuse 52 may be higher or lower than the overcurrent value for the load switch 54. The fuse 52 and the load switch 54 serve to doubly prevent an overcurrent from being supplied to the LDO regulator 56 and the DC/DC converter 58.

The LDO regulator 56 is a circuit that outputs a power supply voltage for the components of the SSD 14 that require a small current. The DC/DC converter 58 is a circuit that outputs a power supply voltage for the components of the SSD 14 that require a large current. The LDO regulator 56 and the DC/DC converter 58 may be configured as individual semiconductor components or as a single integrated semiconductor component, respectively.

The LDO regulator 56 steps down the output voltage from the load switch 54 for generating the power supply voltage. For example, the power supply voltage output from the LDO regulator 56 is supplied to the controller 18.

The DC/DC converter 58 steps up or down the output voltage from the load switch 54 for generating the power supply voltages as required by the different components of the SSD 14. The DC/DC converter 58 is configured with DC/DC converter units that either step up or down the voltage for the different components.

A step-up DC/DC converter unit 58*a* (refer to FIG. 3) steps up the output voltage from the load switch 54 and applies the stepped-up voltage as a charging voltage to the PLP capacitor 24.

A step-down DC/DC converter unit 58*b* (refer to FIG. 3) steps down the output voltage from the load switch 54 to generate a plurality of power supply voltages. These stepped down power supply voltages are applied to the NAND memory 16, the DRAM 20, and the controller 18.

Although not specifically illustrated, an output of a temperature sensor that measures a temperature inside the SSD 14 and an overcurrent detection result from the respective components of the SSD 14 are sent to the control logic 60. The control logic 60, which is connected to the bus line 44, transmits this input data to the controller 18 via the I2C I/F circuit 64 according to the I2C system and receives a control signal according to the I2C system from the controller 18 via the I2C I/F circuit 64.

When it is detected that the power supply voltage generated by the power supply circuit 22 fluctuates according to the temperature of the SSD 14, the controller 18 supplies, to the power supply circuit 22, a control signal for adjusting the voltage generated by the power supply circuit 22 according to the temperature. In addition, when an overcurrent is detected, the controller 18 supplies, to the power supply circuit 22, a control signal for stopping the generation of the voltage applied to the component at which the detected overcurrent flows. The control logic 60 supplies a control signal to the load switch 54, the LDO regulator 56, and the DC/DC converter 58 according to the control signals transmitted from the controller 18.

The I2C I/F circuit 64 is connected to the bus line 44 for the control logic 60 and the controller 18 and communicates with the controller 18 according to the I2C system according to the control signals transmitted from the control logic 60.

Figure 3:
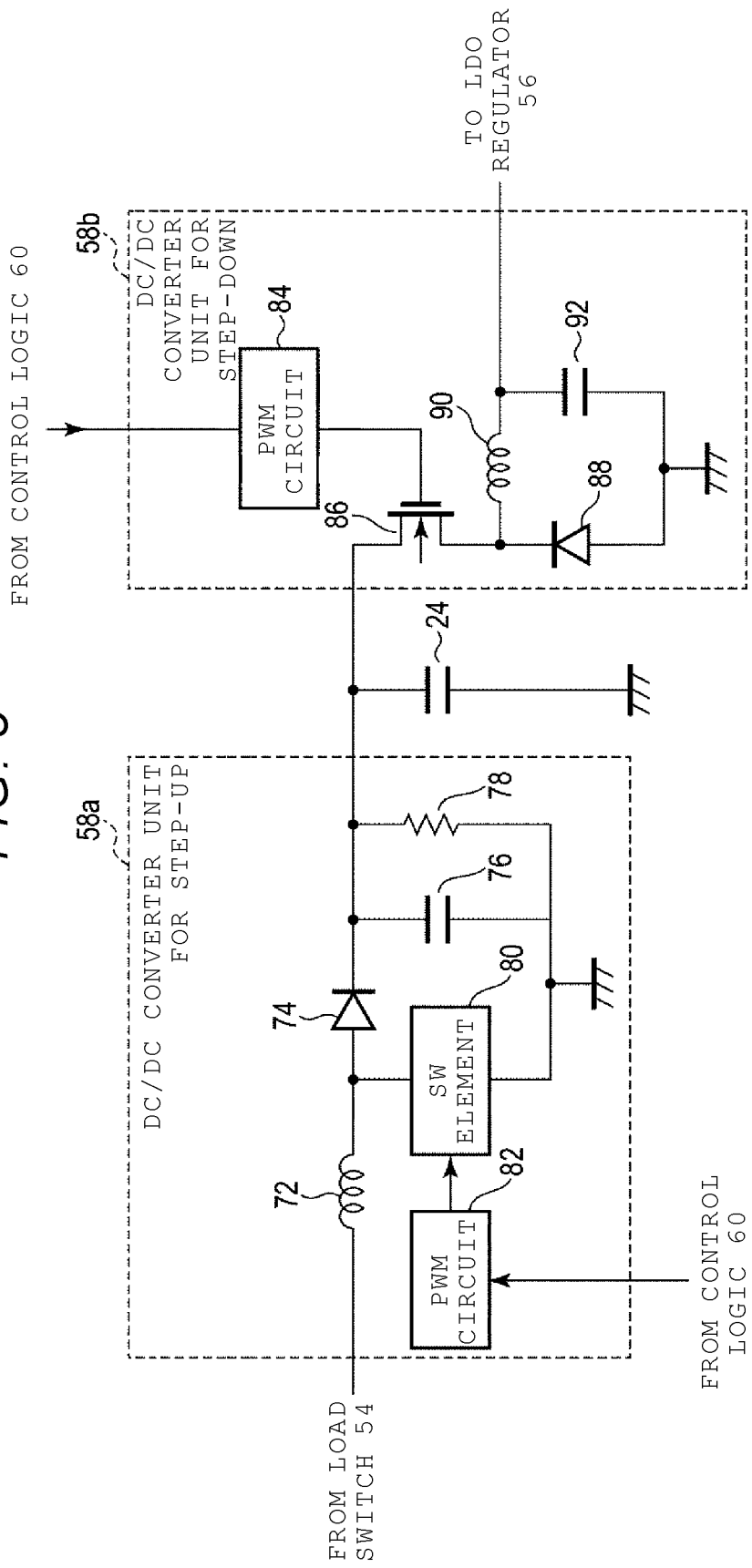
FIG. 3 is a circuit diagram of a DC/DC converter for step-up and a DC/DC converter for step-down in a power supply circuit.

The LDO regulator 56 and the DC/DC converter 58 may have various known configurations for voltage converters, but as an example, a circuit diagram of a step-up DC/DC converter unit 58*a* and a step-down DC/DC converter unit 58*b* within the DC/DC converter 58 is illustrated in FIG. 3.

The step-up DC/DC converter unit 58*a* (DC/DC converter unit 58*a*) steps up the output voltage of the load switch 54 and charges the PLP capacitor 24. The step-down DC/DC converter unit 58*b* (DC/DC converter unit 58*b*) receives a discharge current from the PLP capacitor 24, steps down the output voltage of the PLP capacitor 24, and supplies the stepped-down voltage to the LDO regulator 56.

The DC/DC converter unit 58*a* includes an inductor 72 and a diode 74 connected in series and a capacitor 76 and a resistor 78 connected in parallel. An input current generated from an input voltage is received at one end of the inductor 72. The other end of the inductor 72 is connected to the anode end of the diode 74 and is also connected to ground via a switching element 80 (SW element 80). A cathode end of the diode 74 is connected to ground via parallel paths through the capacitor 76 and the resistor 78. The ground is a reference electrical potential of the DC/DC converter unit 58*a*. A terminal voltage of the resistor 78 is the output voltage of the DC/DC converter unit 58*a*, this terminal voltage is applied to the PLP capacitor 24, and the PLP capacitor 24 is thus charged according to this voltage.

The switching element 80 includes a metal-oxide-semiconductor field-effect transistor (MOSFET) or the like. A pulse width modulation circuit 82 (PWM circuit 82) is connected to a control terminal (e.g., MOSFET gate) of the switching element 80. When the PLP capacitor 24 is being charged, the PWM circuit 82 controls the switching element 80 to be turned on or off based on a control signal transmitted from the control logic 60. When the switching element 80 is turned on, the current flowing through the inductor 72 due to the applied input voltage is increased. When the switching element 80 is turned off, the diode 74 is positively biased, the current through the inductor 72 is decreased, energy is charged to the capacitor 76, and thus, a voltage higher than the input voltage is generated across the resistor 78.

The period of the pulse signal output from the PWM circuit 82 can be constant, and the switching element 80 is periodically turned on or off according to the pulse signal. The voltage output from the DC/DC converter unit 58*a*, that is, the charging voltage for the PLP capacitor 24 changes according to a ratio of on and off in one pulse signal period. The ratio may be also referred to as a duty ratio of an on-pulse or may be a ratio of the on-time interval of the switching element 80 during one period of the pulse signal. The PWM circuit 82 can adjust the duty ratio as needed.

If an upper limit allowable voltage that can be applied to the PLP capacitor 24 is specified, the control logic 60 notifies the PWM circuit 82 of the duty ratio such that the output voltage of the DC/DC converter unit 58*a* will be equal to or less than the allowable voltage. When the PLP capacitor 24 is not being charged, the PWM circuit 82 always outputs a low level signal, so that the switching element 80 will always be in the off state.

The DC/DC converter unit 58*b* includes a MOSFET 86. The PLP capacitor 24 is connected to a drain end of the MOSFET 86. The MOSFET 86 is one example of the switching element. A PWM circuit 84 is connected to a gate terminal of the MOSFET 86. The PWM circuit 84 controls the switching ON or OFF of the MOSFET 86 based on a control signal transmitted from the control logic 60. A source of the MOSFET 86 is connected to a cathode end of the diode 88. The anode end of the diode 88 is connected to ground. The source of MOSFET 86 is also connected to ground via a path through the inductor 90 and a capacitor 92, which are connected in series to each other. The ground is a reference electrical potential of the DC/DC converter unit 58*b*. A connection point (node) between the inductor 90 and the capacitor 92 is an output end of the DC/DC converter unit 58*b*.

When the MOSFET 86 is turned on, the discharge current from the PLP capacitor 24 flows to the output end of the DC/DC converter unit 58*b* via the inductor 90, and thus, the capacitor 92 is charged. In a case of an ideal DC/DC converter having an efficiency of 100%, Vin×Iin=Vout×Iout (where Vin is the input voltage, Vout is the output voltage, Iin is the input current, and Iout is the output current), so that, when stepping down, the output current is required to be greater than the input current. For this reason, when the MOSFET 86 is turned off, a current is extracted from the ground via the diode 88 and the inductor 90 by the energy charged in the capacitor 92, and the current is output from the output end.

The period of the pulse signal output from the PWM circuit 84 can be constant. The MOSFET 86 is periodically turned on or off according to the pulse signal from the PWM circuit 84. The voltage output from the DC/DC converter unit 58*b* changes according to the duty ratio of the MOSFET 86. The control logic 60 notifies the PWM circuit 84 of the duty ratio so that the output voltage of the DC/DC converter unit 58b becomes equal to the output voltage of the load switch 54.

The output voltage from the DC/DC converter unit 58b is applied instead of the output voltage from the load switch 54. Another step-down DC/DC converter unit other than the DC/DC converter unit 58b in the DC/DC converter 58 can step down the voltage to generate a plurality of power supply voltages. Accordingly, during the time interval when the discharge current of the PLP capacitor 24 flows after the external power supply is interrupted, the power supply circuit 22 can continue to supply power supply voltages to the NAND memory 16, the controller 18, and the DRAM 20.

(Current Consumption of SSD 14)

Figure 4A:
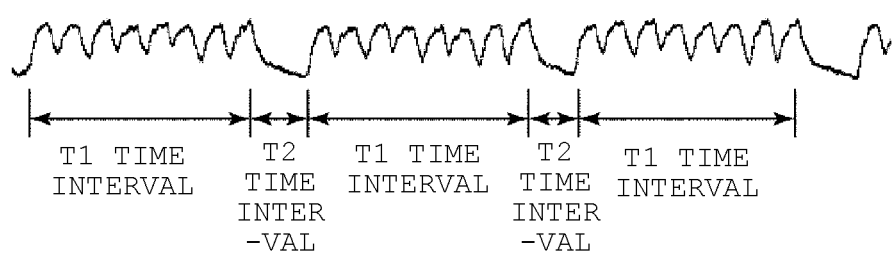
FIGS. 4A and 4B are diagrams illustrating examples of a current consumption waveform supplied to an SSD by an external power supply voltage.
Figure 4B:
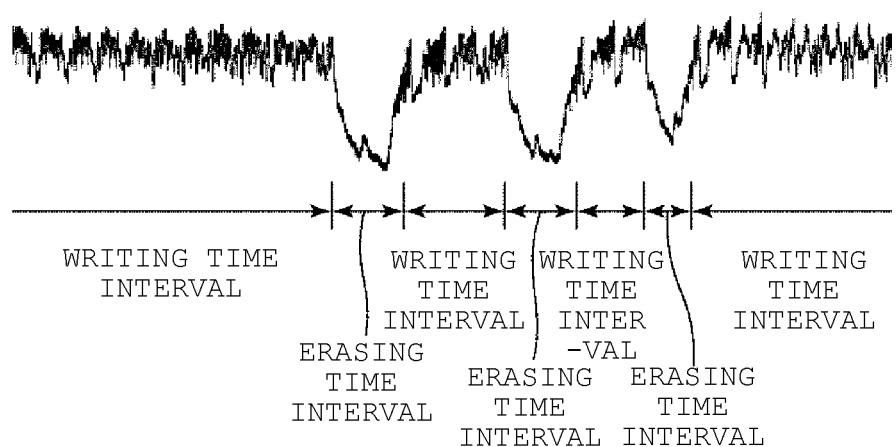

FIGS. 4A and 4B illustrate examples of current consumption waveforms for the SSD 14 corresponding to current supplied from the external power supply to the power supply circuit 22. FIG. 4A illustrates an example of a change in current consumption due to the write operation.

As described above, since the eight NAND chips (the first NAND chip to the eighth NAND chip) per channel are connected, the SSD 14 performs 18 channels×8 interleaves=144 interleaves operation as a whole. The write operation is performed by allowing the NAND I/F circuit 38 to issue a data-in command and a program command to the NAND memory 16. The write data from the host 12 is stored in the DRAM 20. First, the NAND I/F circuit 38 transmits the data-in command and the write data in the DRAM 20 to the NAND memory 16. According to the data-in command, the NAND memory 16 writes the write data into the data buffer (also referred to as a register) in the NAND memory 16. Next, the NAND I/F circuit 38 transmits the program command to the NAND memory 16. According to this program command, the NAND memory 16 writes the write data presently in the data buffer into the memory cells in the NAND chip 16-i.

In one write operation, a data-in operation is first performed on the first NAND chip of each channel, and the write data is written into the data buffer in the NAND memory 16. Specifically, the data-in operation is performed on the first NAND chip of the first channel, the data-in operation is performed on the first NAND chip of the second channel, and so forth, until the data-in operation for the first NAND chip of the 18-th channel. When the write data is written to the data buffer in the NAND memory 16 by the data-in operation, the preparation for the program operation is completed, and the program operations for the first NAND chips of the 18 channels are performed. Specifically, the program operation for the first NAND chip of the first channel is performed, the program operation for the first NAND chip of the second channel is performed, and so forth until the program operation for the first NAND chip of the 18-h channel in the same manner.

As described above, the program operation for the NAND chip of each channel is executed with a time delay from the data-in operation for the NAND chip of the channel. For this reason, a program operation for the NAND chip of one channel may be executed at the same time as the data-in operation for the NAND chip of another channel. In general, the time required for the program operation is considerably longer than the time required for the data-in operation. In addition, although the program operations are continuously executed, there can be a time interval during which a data-in operation is not being executed. For this reason, the current consumption supplied to the SSD 14 during the write operation differs between a T1 time interval in which a data-in operation and a program operation are both being simultaneously executed and a T2 time interval in which a data-in operation is not being executed and only a program operation is executed. The current consumption during the T2 time interval is less than the current consumption during the T1 time interval.

FIG. 4B illustrates an example of a difference in current consumption during a writing time interval and an erasing time interval. Note, the time axes (x-axes) of FIGS. 4A and 4B are at different scales from one another. Multiple pairs of the T1 time interval and the T2 time interval depicted in FIG. 4A would be included in each writing time interval in FIG. 4B. In a NAND memory 16, the data in a memory cell is erased before the actual writing of the data into the memory cell. The current consumption during the erasing time interval is less than the current consumption during the writing time interval.

Thus, the current consumption of the SSD 14 changes according to the type of command executed. Furthermore, even with respect to performance of the same command, the current consumption of SSD 14 changes during the performance of the command. For this reason, if the PLP capacitor 24 can be charged only during a time when the current consumption of the SSD 14 is low, the peak current can be lowered without deteriorating the functioning of the SSD 14.

(Throttling Control)

As a method for adjusting the power consumption of the SSD 14, there is throttling control. In this context, throttling control is to adjust the current consumption of the SSD 14 by limiting the number of commands that can be simultaneously issued by all the NAND controllers 38-j or controlling the timing of command issuance or performance.

Figure 5:
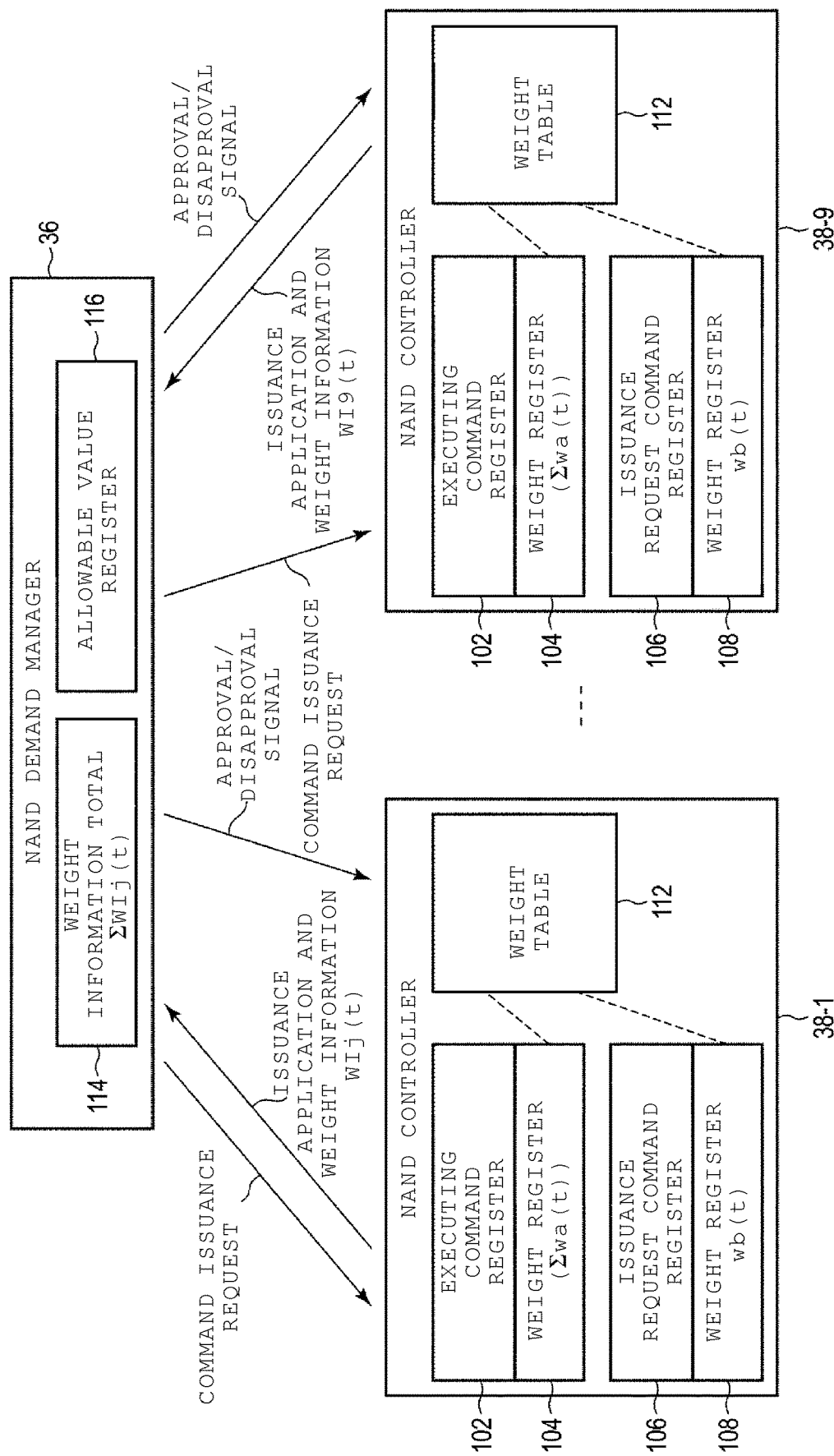
FIG. 5 is a diagram illustrating an outline of a DC/DC converter for step-up and a DC/DC converter for step-down in power supply circuit during a throttling control.

FIG. 5 illustrates an outline of throttling control concepts. The throttling control is performed by the NAND demand manager 36 and the NAND controllers 38-j as follows. The NAND demand manager 36 transmits the command issuance request to the NAND controller 38-j. When the NAND controller 38-j receives the command issuance request, the NAND controller 38-j transmits issuance application and weight information WIj(t) (weight WIj(t)) to the NAND demand manager 36. In throttling control, the amount of current consumed can be managed by allowing the NAND chips 16-i to execute a command according to a weight (weighting factor) for the command. As illustrated in FIGS. 4A and 4B, the current consumption is not constant during the execution of a command and changes with time during execution/performance of the command. For this reason, the weight information WIj(t) is expressed as a function of time.

When the NAND demand manager 36 receives the issuance application and the weight information WIj(t), the NAND demand manager 36 determines whether or not the command can be issued based on a sum ΣWIj(t) of the weight information WIj(t). Based on the determination, the NAND demand manager 36 transmits an approval/disapproval signal for command issuance to the NAND controller 38-j. When the NAND controller 38-j receives the approval signal from the NAND demand manager 36, the NAND controller 38-j issues the command.

The NAND controller 38-j includes an executing command register 102, a weight register 104, an issuance request command register 106, a weight register 108, and a weight table 112.

The weight table 112 stores the weights w(t) of all commands that the NAND I/F circuit 38 (NAND controller 38-j) is expected to issue to the NAND memory 16.

FIG. 6 illustrates an example of the weight table 112. For example, a weight w1(t) is set for an erase command, a weight w2(t) is set for a data-in command, a weight w3(t) is set for a program command, and a weight w4(t) is set for a read command.

Figure 7A:
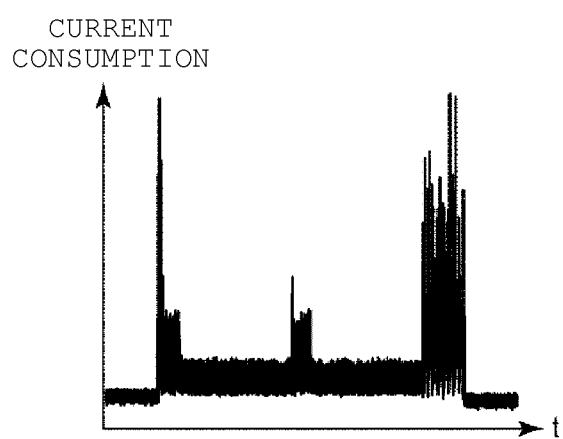
FIGS. 7A to 7D are diagrams illustrating examples of relationships between a current waveform consumed by a NAND chip due to execution of a command and a weight factor.
Figure 7B:
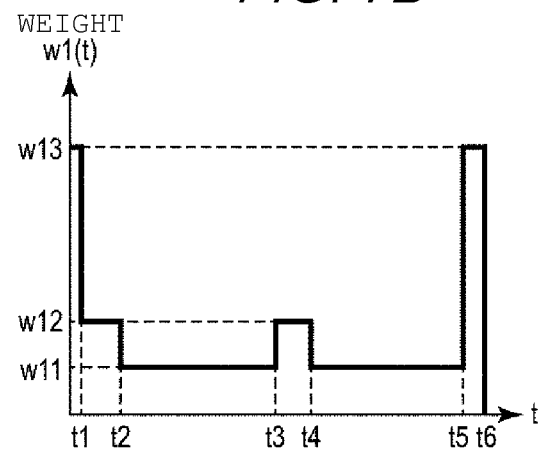

FIG. 7A illustrates the current consumption in an erasing operation executed according to an erase command on one NAND chip 16-$i$. FIG. 7B illustrates the weight w1(t) set for the erase command. Since the current consumption of each NAND chip during the erasing operation is low during the erasing time interval and high during a verify time interval, the weight w1(t) of the erase command is set as follows: when 0<t≤t1 (for example, t1=50), w1(t)=w13 (for example, w13=300); when t1<t≤t2 (for example, t2=200), w1(t)=w12 (for example, w12=100); when t2<t≤t3 (for example, t3=2000), w1(t)=w11 (for example, w11=50); when t3<t≤t4 (for example, t4=2200), w1(t)=w12; when t4<t≤t5 (for example, t5=4000), w1(t)=w11; and when t5<t≤t6 (for example, t6=4200), w1(t)=w13.

In this context, the time interval of t2<t≤t3 and the time interval of t4<t≤t5 each correspond to an erasing time interval. In general, the units of this time are arbitrary time units and time units may be set based on actual or estimated device performance.

Figure 7C:
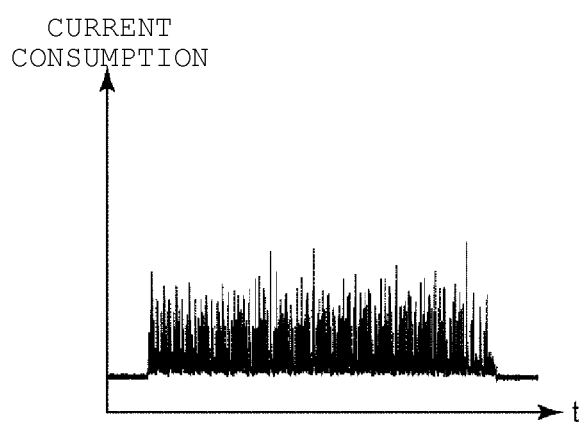
Figure 7D:
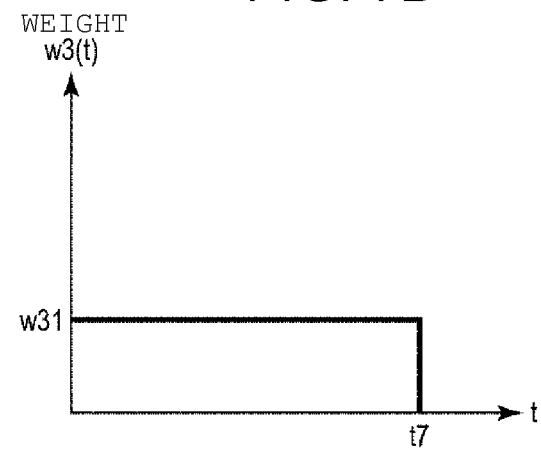

FIG. 7C illustrates the current consumption during a program time interval when a write operation is being executed according to a program command on one NAND chip 16-$i$. FIG. 7D illustrates the weight w3(t) for the program command. Since the current consumption during the program time interval is substantially constant, the weight of the program command is set as w3(t)=w31 (for example, w31=100) when 0<t≤t7 (for example, t7=3000).

The time t for the weight w(t) is the time when t=0 at the start of command execution. Since the execution time intervals of the commands are different, the upper limit of the time t of the weight w(t) set in the command, that is, the time length, is different according to the command.

Returning to the description of FIG. 5, when the NAND demand manager 36 receives a read request, a write request, an erase request, or the like for the NAND chip 16-$i$ from the host 12, or when the NAND demand manager 36 receives a background process request for the NAND memory 16, such as a garbage collection request, a refresh request, or a debug request for the NAND chip 16-$i$ issued from the firmware, sub-components, or the like of the controller 38, the command issuance request is transmitted to the NAND controller 38-$j$ to which the corresponding NAND chip 16-$i$ is connected.

When the NAND controller 38-$j$ receives the command issuance request transmitted from the NAND demand manager 36, the NAND controller 38-$j$ generates the requested command (hereinafter, referred to as an issuance request command), and writes the generated command into an issuance request command register 106.

When the issuance request command is written to the issuance request command register 106, the NAND controller 38-$j$ reads the weight of the issuance request command from the weight table 112 and writes a weight wb(t) for the issuance request command into the weight register 108. The weight wb(t) for the issuance request command represents the change in a predicted value of the current consumed by one NAND chip 16-$i$ that executes the issuance request command during the time interval from the issuance time of the issuance request command to the scheduled time of the execution completion of the issuance request command.

Once the NAND controller 38-$j$ receives the approval signal for the command issuance from the NAND demand manager 36, the NAND controller 38-$j$ issues the issuance request command stored in the issuance request command register 106 to the NAND chip 16, deletes the now-issued command from the issuance request command register 106, and writes the now-issued command into the executing command register 102. The executing command register 102 stores any command (referred to as an executing command) presently being executed by the 16 NAND chips 16 connected to the NAND controller 38-$j$.

When the NAND controller 38-$j$ writes the issued command into the executing command register 102, the NAND controller 38-$j$ also deletes the weight wb(t) of the issued command from the weight register 108 and writes the weight wb(t) (as a weight wa(t) of the executing command) into the weight register 104. The weight register 104 stores a total weight Σwa(t) (Σwa(t)=wa1(t)+wa2(t)+ . . . ) of the weights wa1(t), wa2(t) . . . for executing commands stored in the executing command register 102. The total weight Σwa(t) represents the change in a predicted value of the current consumption during the time interval from the issuance time of the latest command among the commands issued by the NAND controller 38-$j$ to the scheduled time of the execution completion.

The time in the weight wb(t) of the issuance request command is the time when the issuance time of the issuance request command is set to t=0, and the time t in the total weight Σwa(t) of the executing command is the time when the issuance time of the latest command is set to t=0. For this reason, the NAND controller 38-$j$ sets the time t=0 of the weight wb(t) of the issuance request command as the issuance time of the latest command and sets the weight wb(t) of the issuance request command as the total weight Σwa(t) of the executing commands to write the weight into the weight register 104.

The weight information WIj(t) together with the issuance application transmitted by the NAND controller 38-$j$ to the NAND demand manager 36 is the sum (WIj(t)=Σwa(t)+wb(t)) of the total weight Σwa(t) stored in the weight register 104 and the weight wb(t) stored in the weight register 108. When the NAND controller 38-$j$ transmits the command issuance application to the NAND demand manager 36, the NAND controller 38-$j$ obtains the weight information WIj(t). The NAND controller 38-$j$ sets the time t=0 of the weight wb(t) of the issuance request command as the issuance time of the latest command and calculates the sum (WIj(t)=Σwa(t)+wb(t)) of the total weight Σwa(t) stored in the weight register 104 and the weight wb(t) stored in the weight register 108.

The NAND demand manager 36 includes a total weight information register 114 that stores the sum ΣWIj(t) (hereinafter, referred to as total weight information) of the weight information WIj(t) transmitted from all the NAND controllers 38-$j$ and an allowable value register 116 that stores the allowable (maximum) value of the total weight information ΣWIj(t). Since the weight corresponds to the current consumption, the allowable value of the total weight information ΣWIj(t) corresponds to the allowable value of the current consumption of the SSD 14.

Each time the NAND demand manager 36 receives weight information WIj(t) from any one of the NAND controllers 38-$j$, the NAND demand manager 36 recalculates the total weight information ΣWIj(t) and updates the total weight information ΣWIj(t) stored in the total weight information register 114.

Figure 8:
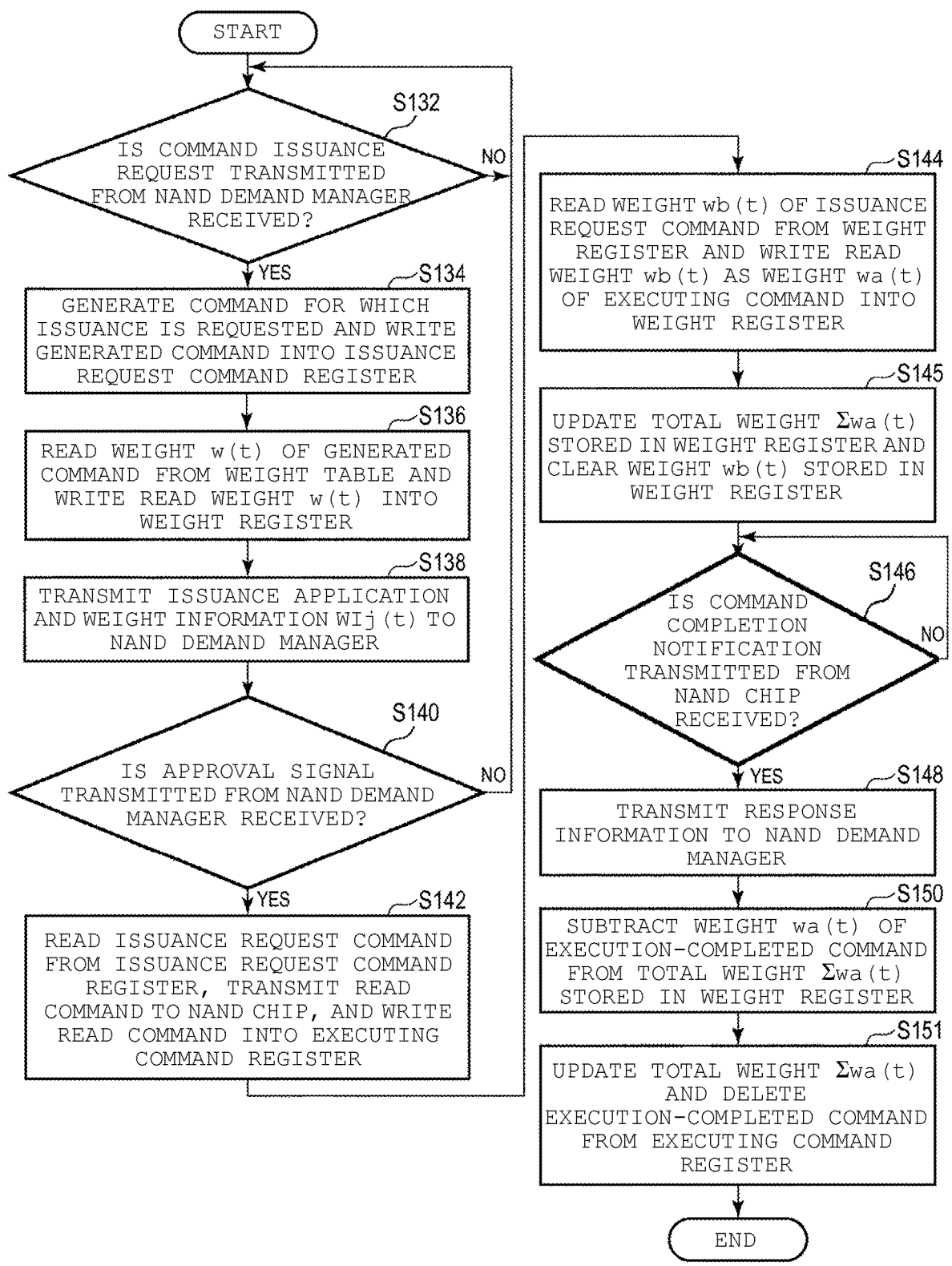
FIG. 8 is a flowchart illustrating an example of processes of a NAND controller that performs throttling control.
Figure 9:
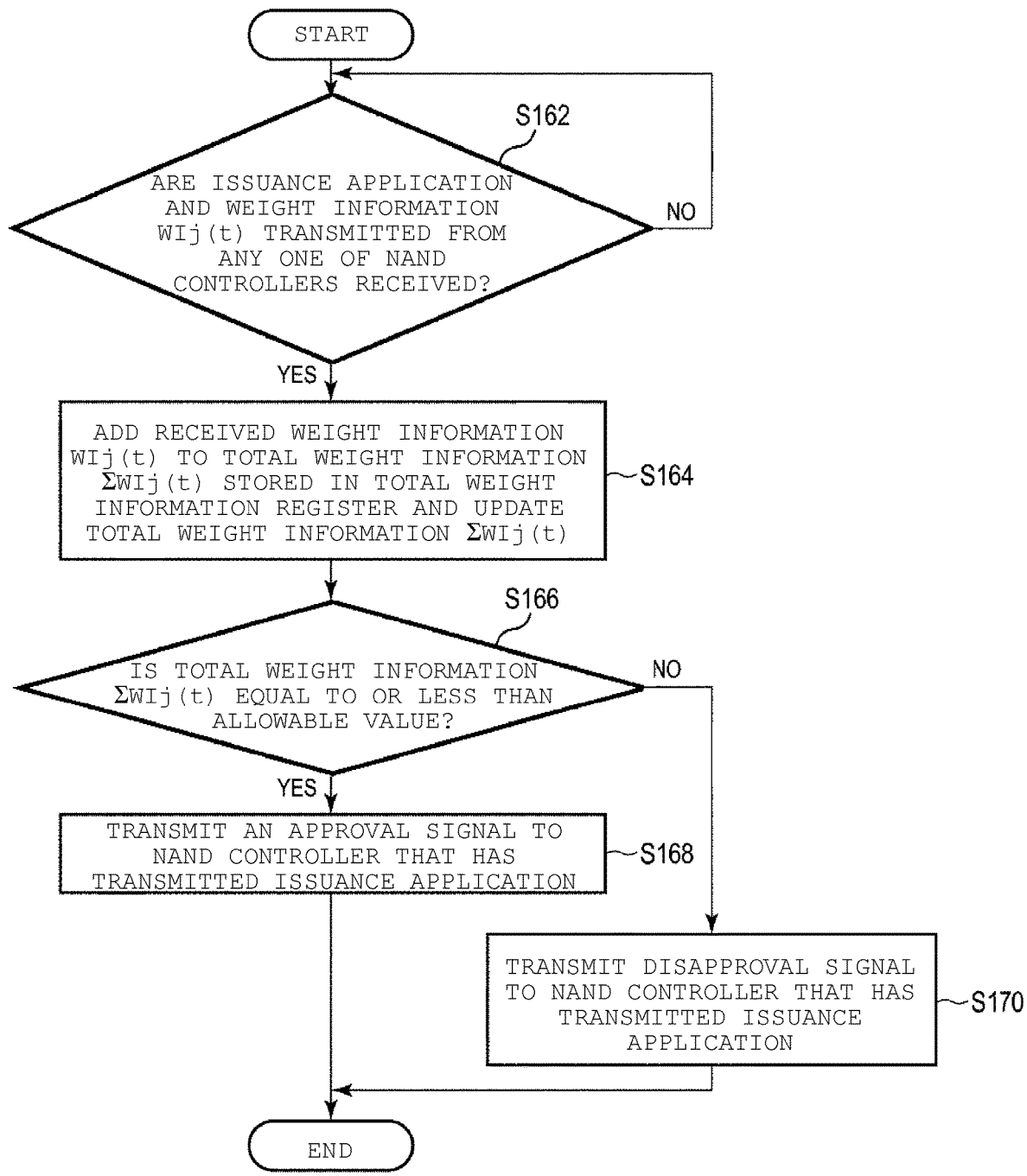
FIG. 9 is a flowchart illustrating an example of processes of a NAND demand manager that performs throttling control.

FIG. 8 is a flowchart illustrating an example of processes of a NAND controller 38-$j$ that performs throttling control. FIG. 9 is a flowchart illustrating an example of processes of the NAND demand manager 36 that performs throttling control.

The NAND controller 38-*j* determines in FIG. 8 (S132) whether or not the command issuance request transmitted from the NAND demand manager 36 has been received.

The NAND controller 38-*j* repeatedly executes the determination process of S132 until a command issuance request from the NAND demand manager 36 is received.

When the command issuance request is received (YES in S132), the NAND controller 38-*j* generates the command for which the issuance was requested and writes the generated command into the issuance request command register 106 (S134).

In S136, the NAND controller 38-*j* reads the weight w(t) of the generated command from the weight table 112 and writes the read weight w(t) as the weight wb(t) of the issuance request command into the weight register 108. When the weight wb(t) is written to the weight register 108, the weight information WIj(t) (=Σwa(t)+wb(t)) is updated. The weight information WIj(t) indicates a predicted value of the total current consumed by the 16 NAND chips 16 connected to the NAND controllers 38-*j* during the time interval from the issuance time of the issuance request command to the scheduled time of the execution completion.

In S138, the NAND controller 38-*j* transmits the issuance application and the weight information WIj(t) to the NAND demand manager 36. The issuance application asks the NAND demand manager 36 whether or not the command for which issuance is requested may be issued.

In S162 of FIG. 9, the NAND demand manager 36 determines whether or not the issuance application and the weight information WIj(t) transmitted from any one of the NAND controllers 38-*j* has been received.

The NAND demand manager 36 repeatedly executes the determination process of S162 until the NAND demand manager 36 receives an issuance application and weight information WIj(t) from one of the NAND controllers 38-*j*.

In S164, when the NAND demand manager 36 receives the issuance application and the weight information WIj(t) transmitted from any one of the NAND controllers 38-*j* (YES in S162), the NAND demand manager 36 adds the received weight information WIj(t) to the total weight information ΣWIj(t) stored in the total weight information register 114 and updates the total weight information ΣWIj(t). The total weight information ΣWIj(t) represents the predicted value of the total current consumed by the 144 NAND chips 16-*i* connected to all the NAND controllers 38-*j* during the time interval from the issuance time of the issuance request command to the scheduled time of the execution completion.

In S166, the NAND demand manager 36 determines whether or not the total weight information ΣWIj(t) will be less than or equal to the allowable value stored in the allowable value register 116 during the time interval from the issuance time of the issuance request command to the scheduled time of the execution completion.

In S168, when the NAND demand manager 36 determines that the total weight information ΣWIj(t) is less than or equal to the allowable value for all times during the time interval from the issuance time of the issuance request command to the scheduled time of the execution completion (YES in S166), since it can be predicted that the current consumption of the SSD 14 will not exceed the allowable value even if the command regarding the issuance application were to be issued, the NAND demand manager 36 transmits an approval signal to the NAND controller 38-*j* that transmitted the issuance application.

In S170, when the NAND demand manager 36 determines that total weight information ΣWIj(tc) exceeds the allowable value at some point during the time interval from the issuance time of the issuance request command to the scheduled time of the execution completion (NO in S166), the NAND demand manager 36 transmits the disapproval signal to the NAND controller 38-*j* that transmitted the issuance application since the predicted current consumption of the SSD 14 is not maintained at or below the allowable value should the command regarding the issuance application be issued.

The NAND demand manager 36 completes the process for one issuance application by executing S168 or S170, but the NAND demand manager 36 executes a reception determination process of S162 again after executing S168 or S170.

Accordingly, when the NAND demand manager 36 predicts that the current consumption of the SSD 14 exceeds the allowable value, the NAND demand manager 36 does not approve the issuance of the command, so that the current consumption of the SSD 14 is prevented from exceeding the allowable value.

Returning to the description of FIG. 8, in S140, after the NAND controller 38-*j* transmits the issuance application and the weight information WIj(t) to the NAND demand manager 36 in S138, the NAND controller 38-*j* determines whether or not the approval signal from the NAND demand manager 36 has been received.

When the disapproval signal is received (NO in S140), the NAND controller 38-*j* executes the reception determination process of the command issuance request in S132 again.

When the approval signal is received (YES in S140), the NAND controller 38-*j* issues the command corresponding to the approved issuance application to the NAND chip 16-*i*. Specifically, in S142, the NAND controller 38-*j* reads the issuance request command from the issuance request command register 106, transmits the read command to the NAND chip 16-*i*, and writes the read command into the executing command register 102.

In S144, the NAND controller 38-*j* reads the weight wb(t) of the issuance request command from the weight register 108 and writes the read weight wb(t) as the weight wa(t) of the executing command into the weight register 104. In S145, the NAND controller 38-*j* updates the total weight Σwa(t) stored in the weight register 104 and clears the weight wb(t) stored in the weight register 108. In this case, the weight wb(t) becomes 0, but the total weight Σwa(t) is increased by that amount, so that the weight information WIj(t) does not change.

In S146, the NAND controller 38-*j* determines whether or not a command completion notification transmitted from the NAND chip 16-*i* is received.

The NAND controller 38-*j* repeats the determination process of S146 until it receives the command completion notification from the NAND chip 16-*i*.

In S148, if the command completion notification from the NAND chip 16-*i* was received (YES in S146), the NAND controller 38-*j* transmits the response information to the NAND demand manager 36. The response information indicates the execution result of the command requested to be issued by the NAND demand manager 36 replied from the NAND controller 38-*j* to the NAND demand manager 36.

In S150, the NAND controller 38-*j* subtracts the weight wa(t) of the execution-completed command from the total weight Σwa(t) stored in the weight register 104. In S151, the NAND controller 38-*j* updates the total weight Σwa(t) and deletes the execution-completed command from the executing command register 102.

(Charging Control of PLP Capacitor 24)

Figure 10:
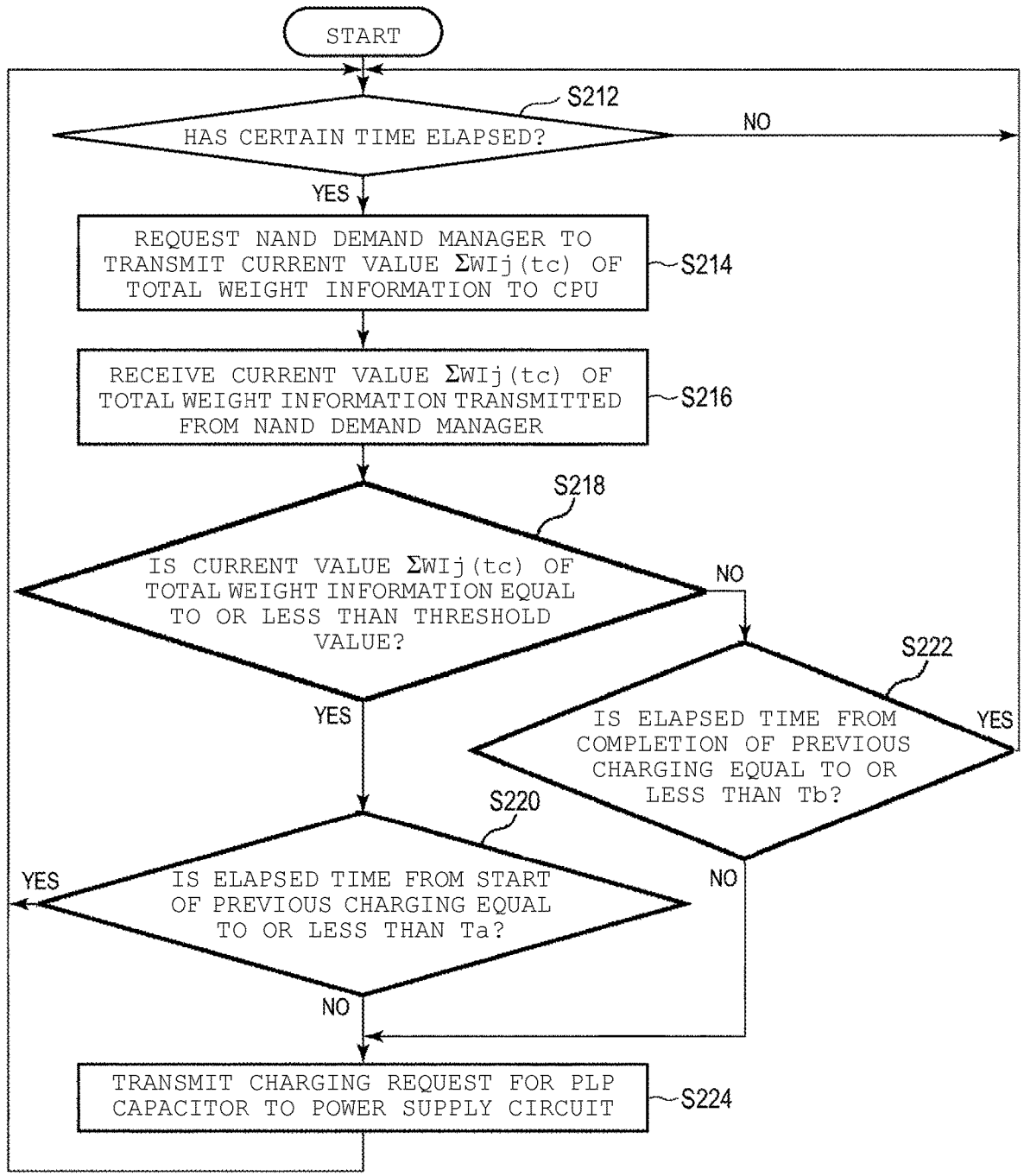
FIG. 10 is a flowchart illustrating an example of processes of a controller that performs charging control for a PLP capacitor.

FIG. 10 is a flowchart illustrating an example of a flow of processes of the controller 18 that controls the charging of the PLP capacitor 24.

The CPU 32 checks whether or not to charge the PLP capacitor 24 at certain time intervals in parallel with the performance of the throttling control. The CPU 32 includes a timer that tracks or counts down a certain time interval. In S212, the CPU 32 checks whether the time interval has elapsed since the SSD 14 last had an opportunity of executing the charging of the PLP capacitor 24 after the start of operation or whether a certain time interval has elapsed since the previous check concerning whether or not to execute the charging. The certain time interval is set to a relatively short time, for example, several microseconds.

In S214, when the set time interval has elapsed (YES in S212), the CPU 32 requests the NAND demand manager 36 to transmit a current value ΣWIj(tc) of the total weight information to the CPU 32. In S216, the CPU 32 receives the current value ΣWIj(tc) of the total weight information transmitted from the NAND demand manager 36.

In S218, the CPU 32 determines whether or not the current value ΣWIj(tc) of the total weight information is equal to or less than a threshold value. In this context, the threshold value is for determining whether the total current consumption is large or small so that the PLP capacitor 24 can be charged if the total current consumption of the SSD 14 is small.

When the current value ΣWIj(tc) of the total weight information is less than or equal to the threshold value (YES in S218), the total current consumption of the SSD 14 is considered small, so that the PLP capacitor 24 may be charged. In S220, the CPU 32 determines whether or not the elapsed time from the start of previous charging is time Ta or less.

When the elapsed time from the start of the previous charging is time Ta or less (YES in S220), the time Ta is not yet elapsed since the start of the previous charging, the PLP capacitor 24 is considered to store sufficient energy to operate the PLP function if necessary, and thus, it can be determined that the PLP capacitor 24 does not need to be recharged yet, so that the CPU 32 executes the determination process of checking the elapse of the set time interval in S212 again.

When the elapsed time from the start of the previous charging exceeds time Ta (NO in S220), it can be assumed that the energy stored in the PLP capacitor 24 may have decreased due to the natural discharging effects. Therefore, in S224, the CPU 32 transmits a charging request for the PLP capacitor 24 to the power supply circuit 22. The charging request is transmitted to the control logic 60 via the bus line 44 and the I2C I/F circuit 64. When the control logic 60 receives the charging request, the control logic 60 controls the PWM circuit 82 of the DC/DC converter 58*a* to turn on or off the switching element 80 of the DC/DC converter 58*a* and starts charging of the PLP capacitor 24.

After transmitting the charging request to the power supply circuit 22, the CPU 32 again executes the determination process of checking the elapse of a set time interval in S212.

In the determination of S218, when the current value ΣWIj(tc) of the total weight information is above the threshold value (NO in S218), the total current consumption of the SSD 14 is considered large, so that the PLP capacitor 24 may not be allowed to be charged. However, if the energy of the PLP capacitor 24 is reduced to less than the energy level necessary for implementing the PLP function, it becomes critical to charge the PLP capacitor 24.

For this reason, in the determination of S218, when the current value ΣWIj(tc) of the total weight information above the threshold value (NO of S218), in S222, the CPU 32 next determines whether the elapsed time since the completion of the previous charging is time Tb or less. The time Tb is longer than the time Ta.

If the elapsed time since the completion of the previous charging is time Tb or less (YES in S222), the PLP capacitor 24 is considered to still store the energy necessary for performing the PLP function. Therefore, the CPU 32 returns to S212 and executes the determination process of checking the elapse of the set time interval again.

When the elapsed time since the completion of the previous charging is greater than time Tb (NO in S222), it can be considered that the PLP capacitor 24 might not store the energy necessary for performing the PLP function. Therefore, in S224, the CPU 32 transmits the charging request for the PLP capacitor 24 to the power supply circuit 22. That is, when the current consumption of the PLP capacitor 24 is large but the energy of the PLP capacitor 24 is at or near the energy level required for implementing the PLP function, the charging is approved as an exception overriding other concerns.

The shorter the set time interval of the timer used for the determination in S212, the lower the possibility that is the determination in S222 will be NO, that is, the lower the possibility of charging the PLP capacitor 24 when the total current consumption of the SSD 14 is large.

According to a memory system 10 according to an embodiment, the expected change in the current consumption as function of time during a command execution time interval is set in advance. Before issuing the command, the controller 18 predicts based on the expected change in overall current consumption over time if the command should be issued. The controller 18 issues the command when the prediction indicates that the current consumption will remain low (below a threshold upper limit value). The controller 18 does not issue the command when the prediction indicates that the current consumption will be high (above a threshold upper limit value). The controller 18 checks the present current consumption at certain time intervals. When the current consumption is small, the controller 18 periodically charges the PLP capacitor 24. When the current consumption is large, the controller 18 charges the PLP capacitor 24 only if the time since last charging exceeds some time limit that corresponds to a longer period than used for charging events when the current consumption is small.

The PLP capacitor 24 is still eventually charged even when the present current consumption is large, and thus, the current consumption of the SSD may be temporarily increased, but the peak current can still be prevented from exceeding the allowable current value of the SSD by reducing (throttling) other device operations. Accordingly, it is possible to achieve both the peak current requirements and the performance requirements.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A memory system, comprising:
   a non-volatile memory;
   a controller configured to write data to the non-volatile memory and read data from the non-volatile memory; and
   a power supply circuit including a capacitor, the power supply circuit configured to supply power to the non-volatile memory and the controller from an external power supply and from the capacitor when the external power supply is interrupted, wherein
   the controller is further configured to control the power supply circuit to preferentially charge the capacitor during times when current consumption of the non-volatile memory is less than a first current level.

2. The memory system according to claim 1, wherein the controller is further configured to control the power supply circuit to charge the capacitor only when a first threshold time has elapsed since a previous charging of the capacitor.

3. The memory system according to claim 2, wherein the controller is further configured to control the power supply circuit to charge the capacitor when the current consumption of the non-volatile memory is not less than the first current level when a second threshold time that is longer than the first threshold time has elapsed since the previous charging of the capacitor.

4. The memory system according to claim 1, wherein the controller is further configured to check the current consumption of the non-volatile memory at fixed time intervals.

5. The memory system according to claim 1, wherein, when a first command is requested to be issued to the non-volatile memory, the controller delays the issuance of the first command when a sum of expected currents consumed by the non-volatile memory when the non-volatile memory executes the first command at the same time as a second command already issued to the non-volatile memory is greater than a second current level.

6. The memory system according to claim 5, wherein the controller is further configured to:
   store a relationship between a plurality of command types and a weighting function for the command type, the weighting function indicating the expected current to be consumed by execution of the command type with respect to time during execution of commands of the command types by the non-volatile memory, and
   check, based on the weighting functions for the second command and for the first command, whether or not the sum of the expected currents to be consumed by the non-volatile memory during the execution of the first command at the same time as the second command is less than the second current level.

7. The memory system according to claim 1, wherein the non-volatile memory comprises a plurality of NAND blocks.

8. The memory system according to claim 1, wherein the non-volatile memory is NAND flash memory.

9. A memory system, comprising:
   a non-volatile memory including a plurality of chips;
   a controller for writing data to the non-volatile memory and reading data from the non-volatile memory; and
   a power supply circuit including a capacitor, the power supply circuit configured to supply power to the non-volatile memory and the controller from an external power supply and from the capacitor when the external power supply is interrupted, wherein
   the controller is configured to control the power supply circuit to track expected current consumption associated with execution of commands by the non-volatile memory and charge the capacitor during times when either the expected current consumption of the non-volatile memory is less than a first current level or the expected current consumption is greater than the first current level but the time since a previous charging of the capacitor exceeds a threshold length of time.

10. The memory system according to claim 9, wherein the controller is further configured to control the power supply circuit to charge the capacitor when the expected current consumption of the non-volatile memory is less than the first current level only when a first threshold time less than the threshold length of time has elapsed since a previous charging of the capacitor.

11. The memory system according to claim 9, wherein the controller is further configured to check the expected current consumption of the non-volatile memory at fixed time intervals.

12. The memory system according to claim 9, wherein, when a first command is requested to be issued to the non-volatile memory, the controller delays the issuance of the first command when a sum of expected currents to be consumed by the non-volatile memory when the non-volatile memory executes the first command at the same time as a second command already issued to the non-volatile memory is greater than a second current level.

13. The memory system according to claim 12, wherein the controller is further configured to:
   store a relationship between a plurality of command types and a weighting function for the command type, the weighting function indicating the expected current to be consumed by execution of the command type with respect to time during execution of commands of the command types by the non-volatile memory, and
   check, based on the weighting functions for the second command and for the first command, whether or not the sum of the expected currents to be consumed by the non-volatile memory during the execution of the first command at the same time as the second command is less than the second current level.

14. The memory system according to claim 9, wherein the non-volatile memory is NAND flash memory.

15. The memory system according to claim 9, wherein the chips are NAND flash memory chips.

16. A method of controlling a memory system including a non-volatile memory and having a power loss protection (PLP) function, the method comprising:
   controlling a power supply circuit to charge a PLP capacitor from an external power supply when current consumption of the non-volatile memory is less than a first current level and the time since a previous charging is greater than a first time, but less than a second time; and
   controlling the power supply circuit to charge the PLP capacitor from the external power supply whenever the time since the previous charging is greater than the second time.

17. The method according to claim 16, further comprising:
   checking the current consumption of the non-volatile memory at fixed time intervals.

18. The method according to claim 16, further comprising:

when a first command is requested to be issued to the non-volatile memory, delaying the issuance of the first command when a sum of expected currents consumed by the non-volatile memory when the non-volatile memory executes the first command at the same time as a second command already issued to the non-volatile memory is greater than a second current level.

19. The method according to claim 18, further comprising:
storing a relationship between a plurality of command types and a weighting function for the command type, the weighting function indicating the expected current to be consumed by execution of the command type with respect to time during execution of commands of the command type by the non-volatile memory, and
checking, based on the weighting functions for the second command and for the first command, whether or not the sum of the expected currents to be consumed by the non-volatile memory during the execution of the first command at the same time as the second command is less than the second current level.

20. The method according to claim 16, wherein the non-volatile memory is NAND flash memory.

* * * * *